(12) United States Patent
Okada

(10) Patent No.: US 7,002,663 B2
(45) Date of Patent: Feb. 21, 2006

(54) BOTH SIDE PROJECTION EXPOSURE APPARATUS

(75) Inventor: Shoichi Okada, Kanagawa (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 107 days.

(21) Appl. No.: 10/742,806

(22) Filed: Dec. 23, 2003

(65) Prior Publication Data

US 2004/0156028 A1   Aug. 12, 2004

(30) Foreign Application Priority Data

Dec. 24, 2002   (JP) .............................. 2002-372106

(51) Int. Cl.
*G03B 27/32*   (2006.01)
*G03B 27/42*   (2006.01)

(52) U.S. Cl. ......................................... 355/26; 355/53

(58) Field of Classification Search ............... 355/26, 355/53, 55, 67; 356/399–401; 250/548
See application file for complete search history.

(56) References Cited

U.S. PATENT DOCUMENTS

| | | | |
|---|---|---|---|
| 5,543,890 A | | 8/1996 | Tanaka et al. |
| 5,881,165 A | | 3/1999 | Tanaka |
| 5,923,403 A | * | 7/1999 | Jain ............................. 355/26 |
| 6,198,525 B1 | * | 3/2001 | Barringer et al. ............. 355/23 |
| 6,459,474 B1 | | 10/2002 | Okada |
| 6,545,744 B1 | * | 4/2003 | Zemel ........................ 355/26 |

FOREIGN PATENT DOCUMENTS

| | | |
|---|---|---|
| JP | 2832672 B2 | 10/1998 |
| JP | 2000-171980 A1 | 6/2000 |

* cited by examiner

*Primary Examiner*—Henry Hung Nguyen
(74) *Attorney, Agent, or Firm*—Rader, Fishman & Grauer PLLC

(57) ABSTRACT

In an exposure apparatus, an exposure stage is moved from an exposure position to a work piece feeding and discharging position, exposure light is emitted from a light emitting unit to a first alignment mark on a first mask and an image of the first alignment mark is projected on a first reflecting material, and a reflected image of the first alignment mark image is detected by the alignment microscope thereby detecting position of the first mask, and when the exposure stage is moved to a reversal handing over position, exposure light is emitted to a second alignment mark of a second mask from the light emitting unit, an image of a second alignment mark of a second mark is projected on a second reflecting material, and a reflected image of the projected second alignment mark image is detected by the alignment microscope thereby detecting position of the second mask.

2 Claims, 8 Drawing Sheets

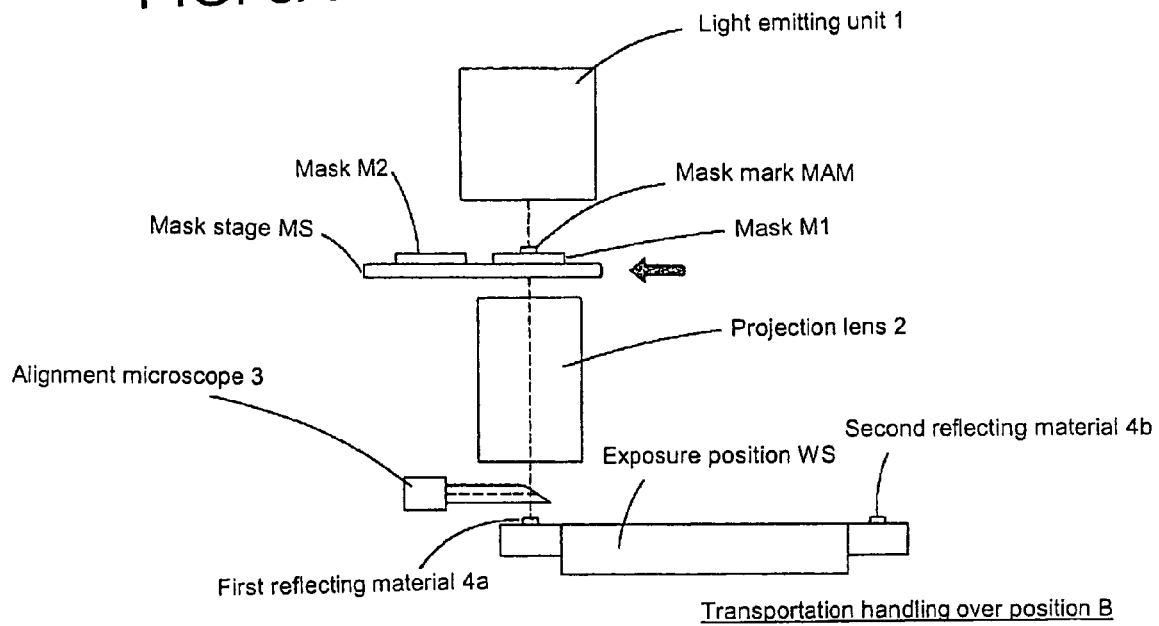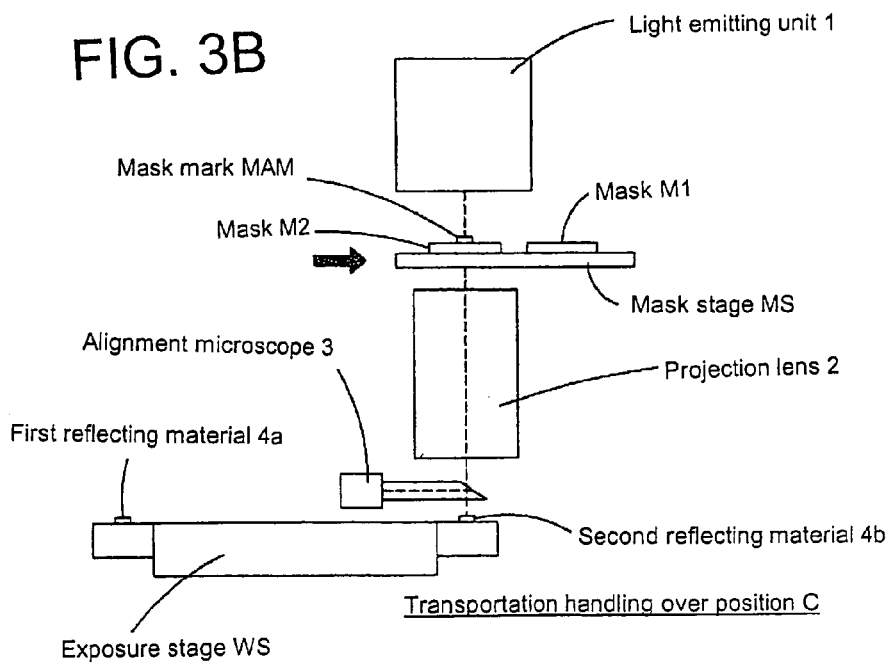

PRIOR ART

BOTH SIDE PROJECTION EXPOSURE APPARATUS

TECHNICAL FIELD OF THE INVENTION

The present invention relates to a both side projection exposure system in which both sides of a substrate (a work piece) is exposed by projection exposure, especially to a projection exposure system capable of exposing both sides of a substrate (work piece) and of providing high throughput at a low price.

DESCRIPTION OF RELATED ART

An exposure apparatus for printing a circuit pattern on both sides of a work piece such as a print substrate etc. is known as a both side projection exposure apparatus.

Japan Patent No. 2,832,673 discloses a proximity exposure apparatus in which exposure light is emitted through a mask on a substrate (a work piece W) which is placed closely to the mask so that mask patterns are exposed on the work piece so as to form the mask patterns on the both sides of the work piece.

The process of the proximity exposure apparatus disclosed in the Japan Patent No. 2,832,673 comprises the following steps of: feeding a work piece W to be exposed to a feeding stage A, positioning the work piece W on a first alignment stage B, exposing the front side of the work piece W on a first exposure stage C, reversing the work piece W on a reversal stage D, positioning the work piece W on a second alignment stage E, exposing the back side of the work piece W on a second exposure stage F, and discharging the work piece W from a discharge stage G.

Japan Laid Open Patent No. 2000-171980 discloses a proximity exposure apparatus which is similar to that disclosed in Japan Patent No. 2,832,673 and in which a mask pattern is exposed on both sides of a work piece.

The proximity exposure apparatus disclosed in Japan Laid Open Patent No. 2000-171980 has work piece supporting stages for exposing front and back sides of a work piece (a plate to be exposed) so as to expose the front and back sides of the work piece in order on the respective stage. Specifically, the proximity exposure apparatus disclosed in Japan Laid Open Patent No. 2000-171980 is designed so as to reduce processing speed by shifting phase of the front side exposure and the back side exposure.

These both exposure apparatuses disclosed in Japan Patent No. 2,832,673 and Japan Laid Open Patent No. 2000-171980 have one light source and have two exposure stations (a work piece stage and a mask stage) so as to carry out both side exposure by changing optical path.

These exposure apparatuses are proximity exposure apparatuses for exposing the work piece by closely placing the work piece to be exposed and the mask having a pattern. Recently, since a substrate as a work piece grows in size, a divisional projection exposure type exposure apparatus is used wherein the work piece is divided into a plurality of exposure areas and each of the divided exposure areas is, in order, exposed by projecting a mask pattern by using a projection lens, as shown in, for example, Japan patent No. 2,994,991.

SUMMARY OF THE INVENTION

The exposure apparatuses shown in Japan Patent No. 2,832,673 and Japan Laid Open Patent No. 2000-171980, relate to proximity exposure apparatuses. Recently, as described above, the divisional projection type exposure apparatus has been adopted. Along with this, it has been desired that an apparatus in which both sides of a work piece are exposed by projection exposure (hereinafter referred to as both side projection exposure apparatus) is adopted.

There are problems described below to realize such an apparatus in which both sides of a work piece are exposed by projection exposure.

In case of adopting the projection exposure disclosed in Japan Patent No. 2,832,673 and Japan Laid Open Patent No. 2000-171980, a projection lens may be disposed between a mask of each exposure station and a work piece. Since the projection lens comprises a plurality of quartz lenses which are precisely ground, the projection lens is expensive, and therefore, where two projection lenses are provided in the apparatus, the cost of the product is increased.

In order to prevent increasing the cost of the apparatus, as shown in FIG. 8, a work piece feeding stage 11, a work piece discharging stage 12 and a work reversal stage 13 for turning (flipping) over the work piece are provided adjacent to the exposure stage WS. Thus, it is possible to reduce the cost, using only one projection lens and one exposure stage WS by providing a light emitting unit, a projection lens, and an alignment microscope (not shown) above the exposure stage WS.

In the exposure apparatus having such a structure, the process thereof comprises the following steps of: transporting a work piece from the work piece feeding stage 11 to the exposure stage WS, exposing the front side of the work piece, transporting the work piece from the exposure stage WS to the work piece reversal stage 13, turning over the work piece on the reversal stage 13, transporting the work piece to the exposure stage WS from the reversal stage 13, exposing the back side of the work piece, and transporting the work piece from the exposure stage WS to the work piece discharging stage 12. Since the exposure process cannot be carried out while the work piece is turned over, the throughput of the process is deteriorated so that the efficiency of the operation is dropped.

Further, usually, a mask pattern to be formed on the front side of the work piece and a pattern to be formed on the back side of the work piece are different. Therefore, it is necessary to replace the mask for the front side with the mask for the back side in the respective exposure process. When the mask is replaced, it is necessary to detect the position of the replaced mask for positioning the work piece with respect to the mask. Further, it is necessary to carry out the positioning every exposure (front side exposure and back side exposure). Accordingly, the throughput of the process is deteriorated unless the detection of the mask position is smoothly carried out.

A gap between the projection lens and the exposure stage is determined based on optical conditions for focusing the mask pattern image on the work piece surface. Since the gap is often small, the structure of the transporting mechanism for feeding the work piece between and the projection lens and the exposure stage, and for discharging the work piece therefrom is constrained thereby decreasing the freedom of design and increasing the cost of the apparatus because it is necessary to make up the apparatus with small and special parts.

Thus, the throughput of the apparatus is deteriorated and the cost is increased even when the structure disclosed in the above references is applied to the both side projection exposure apparatus as it is.

In view of the above problems, the present invention is to provide a projection exposure apparatus capable of exposing both sides of the work piece by projection exposure. It is an object of the present invention to decrease the cost and improve the throughput of the process.

It is another object of the present invention to provide a projection exposure apparatus capable of efficiently carrying out a both side exposure process of a work piece with one projection lens and one exposure stage.

It is a still another object of the present invention to provide a projection exposure apparatus capable of replacing a mask for front side exposure and a mask for back side exposure and detecting the position of the mask.

It is a further object of the present invention to provide a projection exposure apparatus capable of smoothly feeding the work piece to an exposure stage and discharging the work piece.

In order to solve the above problems, in the present invention, an exposure stage on which a work piece is placed and exposed is movable between an exposure position A, a transportation handing over position B where the work piece is fed and discharged, and a reversal handing over position C where the work piece is handed over between mechanisms for turning over the work piece.

The transportation handing over position B and the reversal handing over position C are located adjacent to the exposure position A.

In the exposure position A, a light emitting unit, a mask stage, a projection lens, and an alignment microscope are provided. When the exposure stage is located at the exposure position A, positioning of the mask placed on the mask stage and the work piece placed on the exposure stage are carried out, and exposure light is emitted from the light emitting unit thereby transferring a mask pattern onto the work piece through the mask placed on the mask stage and the projection lens.

In the mask stage, a first mask and a second mask are switchablly disposed and then a first surface (a front side surface) is exposed through the first mask, and a second surface (a back side surface) is exposed through the second mask.

In order to detect the position of the mask/alignment mark attached to the first and second masks, two reflecting materials are provided on the back ends in the exposure stage moving direction. The reflecting materials are located right beneath the projection lens when the exposure stage is located at the transportation handing over position B and the reversal handing over position C. The first and second masks are exposed by exposure light, and the mask/alignment mark image is projected onto the reflecting material, and then a mask mark image reflected on the reflecting material is detected by the alignment microscope thereby detecting and storing the position thereof.

In the transportation handing over position B, a mechanism for placing the work piece fed on the exposure stage, and a mechanism for discharging the work piece, both sides of which have been exposed, from the exposure stage are provided.

In the reversal handing over position C, a reversal mechanism for turning over the work piece is provided. When the exposure stage moves to the reversal handing over position C, the work piece is turned (flipped) over by the reversal mechanism and returned to the exposure stage, the work piece which has been flipped over.

In the both side projection exposure apparatus having such a structure, a controlling unit for controlling both side projection exposure process is provided. By the controlling unit, the exposure stage is moved to the transportation handing over position B thereby feeding the work piece thereto. The exposure stage is moved to the exposure stage A and positioning of the mask and the work piece is carried out, and then the mask pattern is transferred onto the front side surface of the work piece. Next, the exposure stage is moved to the reversal handing over position C thereby turning over the work piece, and the exposure stage is returned to the exposure position A, and the mask pattern is exposed on the back side of the work piece. The exposure stage is moved to the transportation handing over position B thereby discharging the work piece, both sides of which, thus, are exposed.

When the (n−1)th, the (n)th, the (n+1)th, and the (n+2)th work pieces are transported in order, each of the work pieces are exposed in the following order:

(1) the first surface (front side surface) of the (n)th work piece, (2) the second surface (back side surface) of the (n−1)th work piece, (3) the first surface (front side surface) of the (n+1)th work piece, (4) the second surface (back side surface) of the (n)th work piece, (5) the first surface (front side surface) of the (n+2)th work piece, and (6) the second surface (back side surface) of the (n+1)th work piece.

When the work piece exposed in the exposure process is replaced with a non-exposed work piece, and when the work piece whose front side surface has been exposed is replaced with a reversed work piece, the exposure stage is evacuated from the exposure position which is located beneath the projection lens to the respective handing over position.

When the exposure stage is transported or the work piece is replaced, or when the exposure stage is located at the transportation handing over position B or the reversal handing over position C so that a mask for exposing a first surface (front side surface) is replaced with a mask for exposing a second surface (back side surface) or the mask for the second surface (back side surface) is replaced with the mask for the first surface (front side surface), exposure light is emitted through the mask thereby projecting the mask/alignment mark onto the reflecting material and an alignment mark image reflected from the reflecting material is detected by the alignment microscope thereby detecting and storing the position thereof.

When the exposure stage is located at the exposure position A, the alignment mark of the work piece is detected by the alignment microscope, and positioning of the mask and the work piece is carried out based on the stored position information of the alignment mark on the mask.

As such, an alignment process is defined as detection of the alignment mark by the alignment microscope and storing of the alignment mark information, and positioning of the mask and the work piece.

In the present invention, as described above, since the exposure of the second surface (back side surface) of the (n−1)th work piece and the exposure of the first surface (front side surface) of the (n+1)th work piece is carried out in a period from the exposure of the first surface (front side surface side) of the (n)th work piece to the exposure of the second surface (back side surface) of the (n)th work piece, the exposure process becomes smooth so that the processing time can be reduced.

Since the two reflecting materials are attached to the exposure stage and further when the exposure stage is moved, the alignment mark image of the mask is projected on the reflecting material, and the position of the alignment mark of the mask is stored at the same time when the work piece is replaced, it is possible to replace the work piece, and at the same time to detect the position of the mask thereby preventing the throughput from deteriorating. As a result, right after that it is possible to move on to the positioning of the mask and the work piece, and it is possible to smoothly carry out a series of the exposure processes.

Further, when the work piece is replaced, the exposure stage is moved to the transportation handing over position B or the reversal handing over position C so that the exposure stage deviates from the position at which the exposure stage is located beneath the projection lens. Therefore, the mechanism for transporting the work piece can be operated without being interrupted by the projection lens etc., provided at the exposure position, and it is possible to reduce the structural restriction of the mechanism for transporting the work piece.

DESCRIPTION OF THE DRAWINGS

FIG. 3A shows the both side exposure apparatus wherein the exposure stage is at a transportation handing over position B (shown in FIG. 1);

FIG. 3B shows the both side exposure apparatus wherein the exposure stage is located at a reversal handing over position C (shown in FIG. 1);

DETAILED DESCRIPTION OF THE INVENTION

The present invention will become more apparent from the following detailed description of the embodiments and examples of the present invention.

Figure 1:
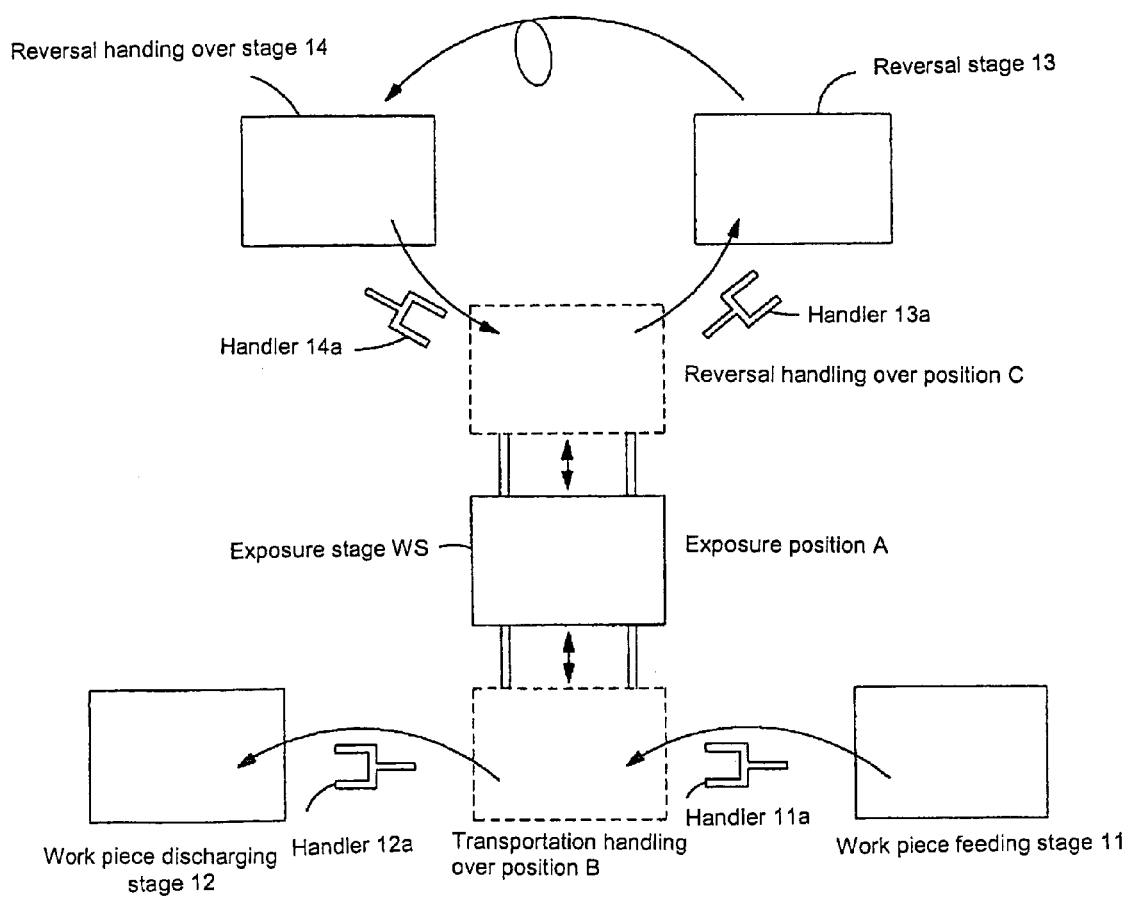
FIG. 1 is a top plan view of a both side exposure apparatus according to the present invention.
Figure 2A:
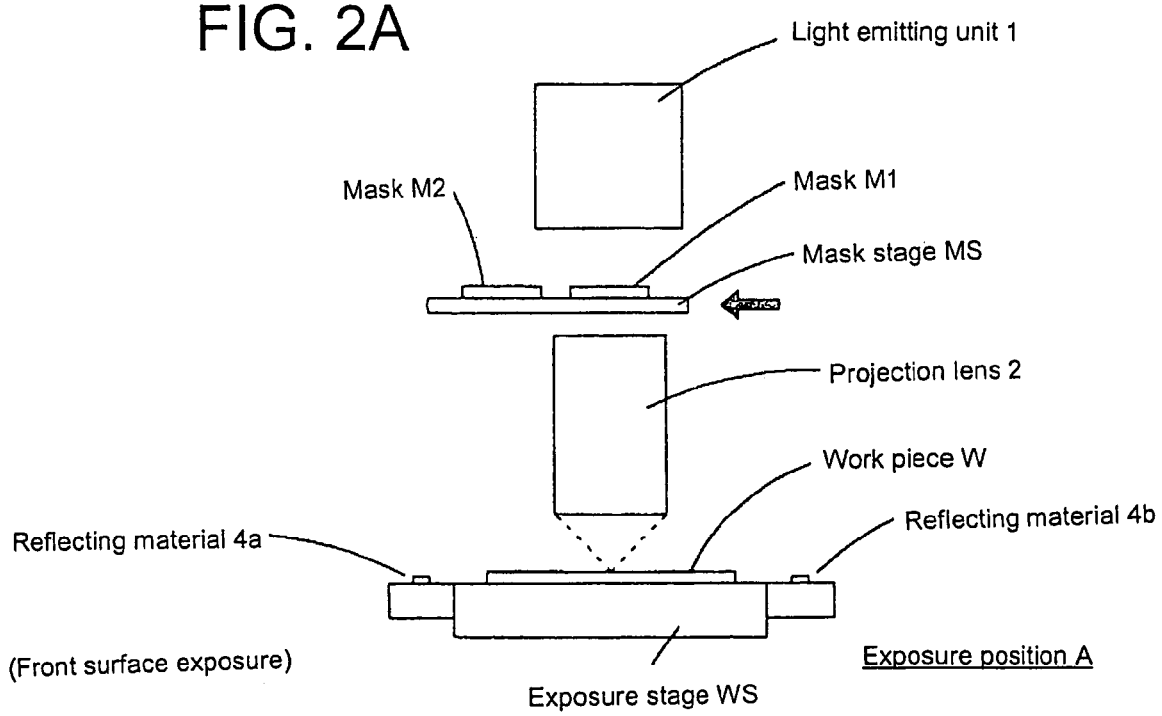
FIGS. 2A and 2B show a side elevational view of the both side exposure apparatus wherein an exposure stage is at an exposure position A (shown in FIG. 1)
Figure 2B:
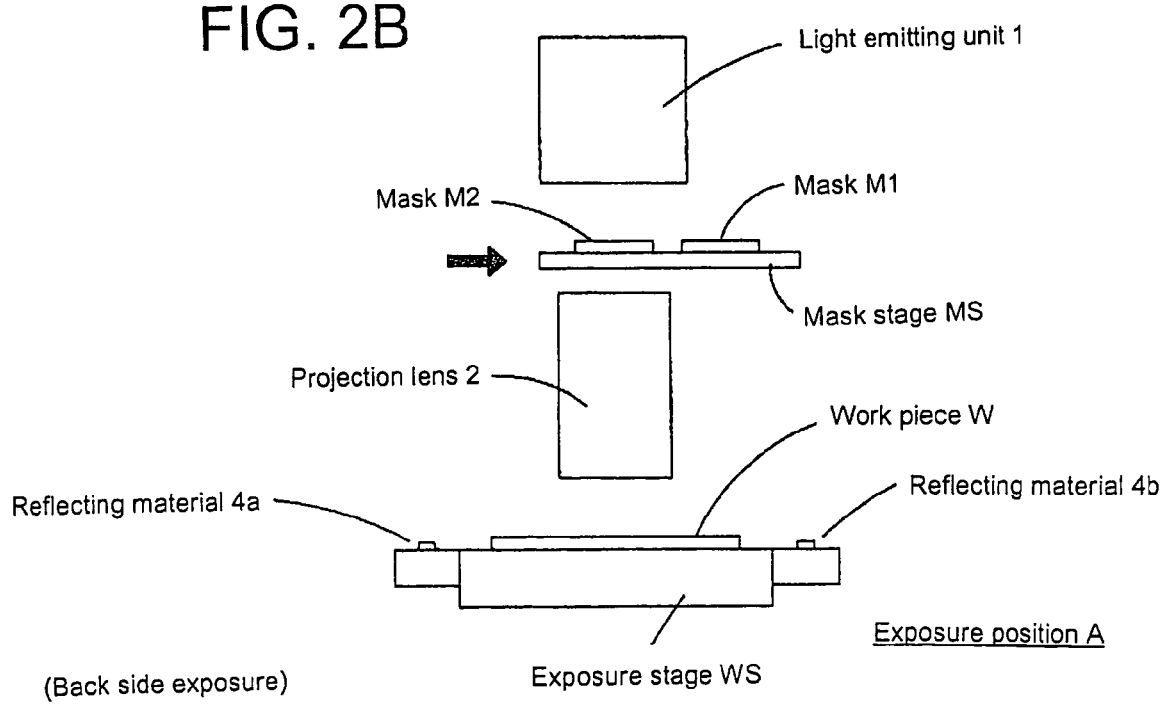

FIGS. 1 to 3 show a schematic view of a both side exposure apparatus of an embodiment according to the present invention. FIG. 1 is a top plan view of the both side exposure apparatus according to the present invention. FIGS. 2 and 3 show a side elevational view of the both side exposure apparatus according to the present invention. Specifically, FIGS. 2A and 2B show the both side exposure apparatus wherein an exposure stage is at an exposure position A (shown in FIG. 1). FIG. 3A shows the both side exposure apparatus wherein the exposure stage is at the transportation handing over position B (shown in FIG. 1). FIG. 3B shows the both side exposure apparatus wherein the exposure stage is located at the reversal handing over position C (shown in FIG. 1).

Description of the structure of the both side exposure apparatus according to the present invention will be given below.

The exposure stage WS shown in FIG. 1 holds the work piece, and an exposure process is carried out thereon.

The exposure stage WS is adopted so as to be movable by a driving mechanism not shown between the exposure position A which is beneath the projection lens and at which exposure is carried out, the transportation handing over position B where the work piece whose front and back sides have been exposed is replaced with an unprocessed work piece, and the reversal handing over position C where the work piece whose front side surface has been exposed is replaced with a reversed work piece whose back side surface is going to be exposed.

Figure 4:
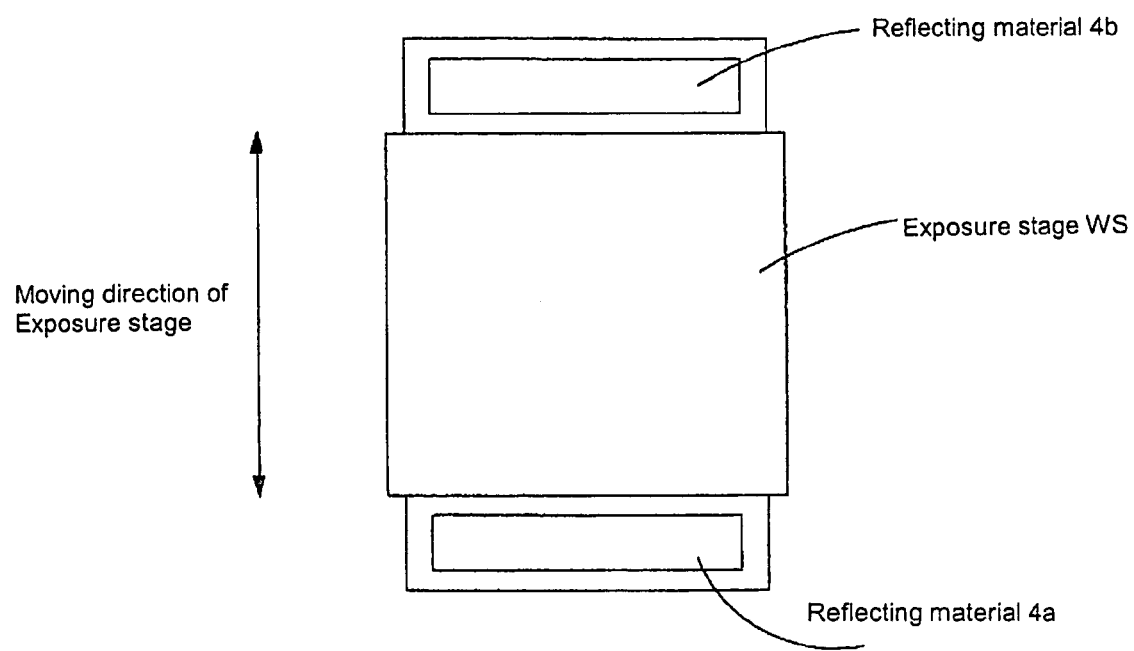
FIG. 4 shows a plain view of the exposure stage to explain reflecting materials disposed on the exposure stage.

In the exposure stage WS, as shown in FIG. 4, first and second reflecting materials 4a and 4b for reflecting an image of mask/alignment mark (hereinafter referred to as a mask mark) are provided at back ends in the transportation direction of the exposure stage WS. The first and second reflecting materials 4a and 4b are made of, for example, glass or mirror. In FIG. 1, these reflecting materials are omitted. FIG. 4 shows a plain view of the exposure stage.

In the exposure position A, as shown in FIGS. 2A and 2B, the light emitting unit 1 for emitting exposure light, the mask stage MS having the masks M1 and M2, and the projection lens 2 are disposed. Further, as described below, the alignment microscope 3 (refer to FIGS. 3A and 3B) which is inserted at time of alignment and is drawn back at time of exposure is provided. Although, in FIGS. 3A and 3B, only one alignment microscope 3 is shown, in fact, two alignment microscopes 3 are provided on the front and back sides.

When the exposure stage WS is located at the exposure position A, a work piece/alignment mark (hereinafter referred to as a work piece mark) which is provided on the work piece W is detected, and positioning (alignment) of the mask and the work piece is carried out based on the stored information of the mask mark position. Detailed description of the positioning of the mask and the work piece is given below. Refer to Japan Patent No. 2,994,991 etc. about detailed description of detection of the mask mark and positioning of the mask and the work piece.

After the alignment ends, exposure light is emitted through the mask M1 or M2 and the projection lens 2 onto the work piece W placed on the exposure stage WS from the light emitting unit 1 thereby transferring the mask pattern of the mask M1 or M2 onto the work piece W. On the mask stage MS according to the present invention, the first mask M1 having a mask pattern for exposing the first surface (front side surface) of the work piece and the second mask M2 having a second mask pattern for exposing the second surface (back side surface) of the work piece are placed.

As shown in FIGS. 2A and 2B, the mask stage MS horizontally moves in the directions shown by arrows in the figures by a driving mechanism (not shown) thereby switching a mask to be used.

When the front side surface of the work piece is exposed, exposure light from the light emitting unit 1 is emitted to the mask M1 placed on the mask stage MS as shown in FIG. 2A, and the mask pattern of the mask M1 is projected onto the front side surface of the work piece W placed on the exposure stage WS through the projection lens 2.

When the back side surface of the work piece is exposed, as shown in FIG. 2B, the mask stage MS is moved, and exposure light from the light emitting unit 1 is emitted to the mask M2 thereby projecting the mask pattern of the mask M2 onto the back side of the work piece W placed on the exposure stage WS through the projection lens 2.

The structure of the light emitting unit 1 (exposure light emitting apparatus), the masks, the mask stage MS, the projection lens 2, the alignment microscope 3 (an alignment unit), the exposure stage WS (a work stage) is basically the same as that shown in Japan Patent No. 2,994,991.

When the exposure stage WS is located at the transportation handing over position B, as shown in FIG. 3A, the alignment microscope 3 is inserted between the projection lens 2 and the exposure stage W, and then exposure light emitted from the light emitting unit 1 is emitted onto the mask mark MAM formed on the mask M1 thereby projecting the mask mark image to the first reflecting material 4a through the projection lens 2 and then the mask mark image is reflected on the first reflecting material 4a and is detected by the alignment microscope 3. The detected mask mark image is processed by the image processing unit described below and then the position information is stored in a memory.

When the exposure state WS is located at the reversal handing over position C, as shown in FIG. 3B, the mask M1 on the mask stage MS is replaced with the mask M2. After that, the alignment microscope 3 is inserted, exposure light emitted from the light emitting unit 1 is emitted to the mask mark MAM formed on the second mask M2, and the mask mark image is projected through the projection lens to the second reflecting material 4b and is reflected on the second reflecting material 4b so as to be detected by the alignment microscope 3. The detected mask mark image is processed in the image processing unit described above, and then the position information thereof is stored in a memory.

Referring to FIG. 1, in the work piece feeding stage 11, a work piece to be exposed is put on standby for the following exposure process. The work piece is fed from outside the exposure apparatus according to the present invention by a transportation apparatus (not shown). When the exposure stage WS is located at the transportation handing over position B, the fed work piece W is held and placed in a predetermined position of the exposure stage WS by a handler 11a.

In the work piece discharging stage 12, the work piece whose front and back sides have been exposed is held to be discharged outside the exposure apparatus. When the exposure stage WS on which the work piece W whose front and back sides have been exposed is placed is located at the transportation handing over position B, the work piece W is held by the handler 12a and then transported onto the work piece discharging stage 12 from the exposure stage WS.

In the reversal stage 13 and the reversal handing over stage 14, the work piece W is turned (flipped) over. The work piece W is turned over as shown in FIGS. 5A, 5B, 5C and 5D. These figures show a side elevational view of the reversal stage 13 and reversal handing over stage 14.

Figure 5A:
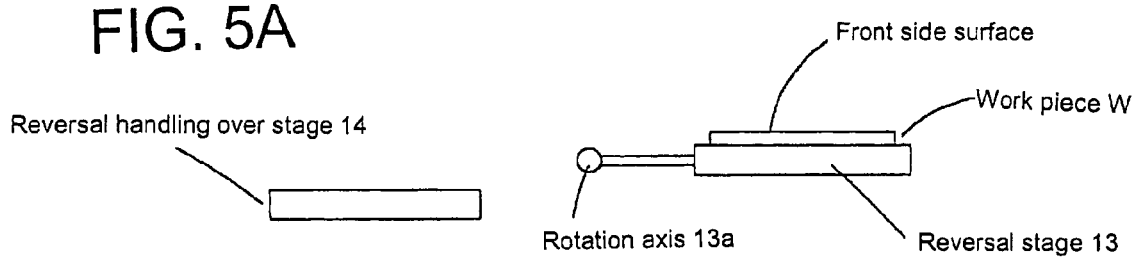
FIGS. 5A, 5B, 5C and 5D are diagrams for explaining reversal of a work piece.
Figure 5B:
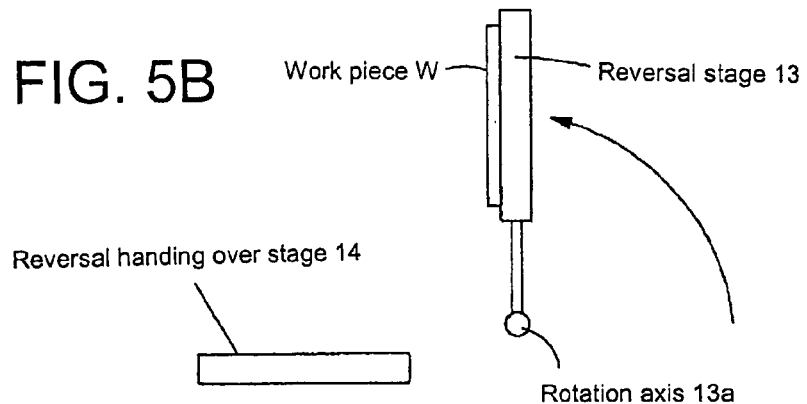
Figure 5C:
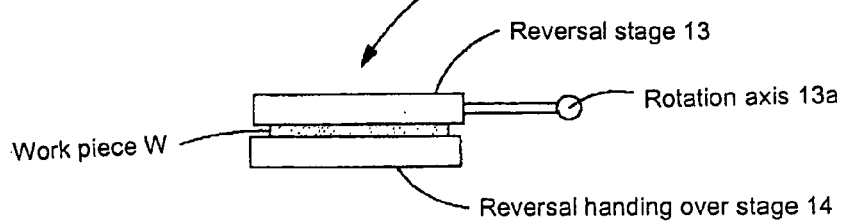

As shown in FIG. 5A, when the work piece W is placed on the reversal stage 13, the work piece W is held on the reversal stage 13 by a vacuum attachment mechanism (not shown). At that state, the reversal stage 13 is rotated with respect to the rotation axis 13a as shown in FIGS. 5B and 5C, and the work piece is placed on the reversal handing over stage 14 so that the front side surface of the work piece W faces down.

Figure 5D:
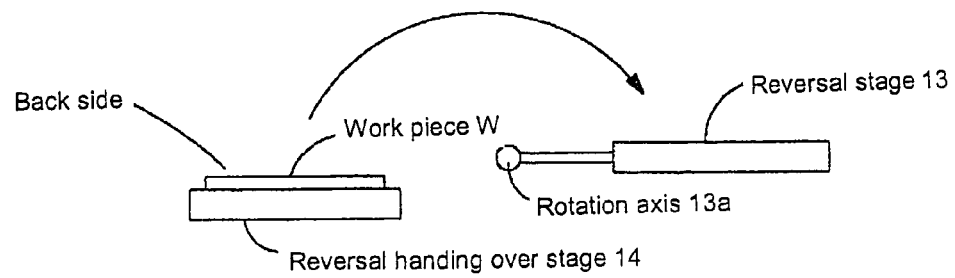

Next, the reversal stage 13 releases the work piece and is rotated back to the original position as shown in FIG. 5D. The work piece W is placed on the reversal handing over stage 14 wherein the back side surface of the work piece W faces up.

The transportation of the work piece W from the exposure stage WS to the reversal stage 13 and the transportation of the reversed work piece W from the reversal handing over stage 14 to the exposure stage WS is carried out when the exposure stage WS is located at the reversal handing over position C shown in FIG. 1.

That is, when the exposure stage WS is located at the reversal handing over stage C shown in FIG. 1, the work piece whose front side surface has been exposed is placed on the reversal stage 13 by the handler 13a from the exposure stage WS, and then the reversed work piece W on the reversal handing over stage 14 is returned to the exposure stage WS by the handler 14a.

Figure 6:
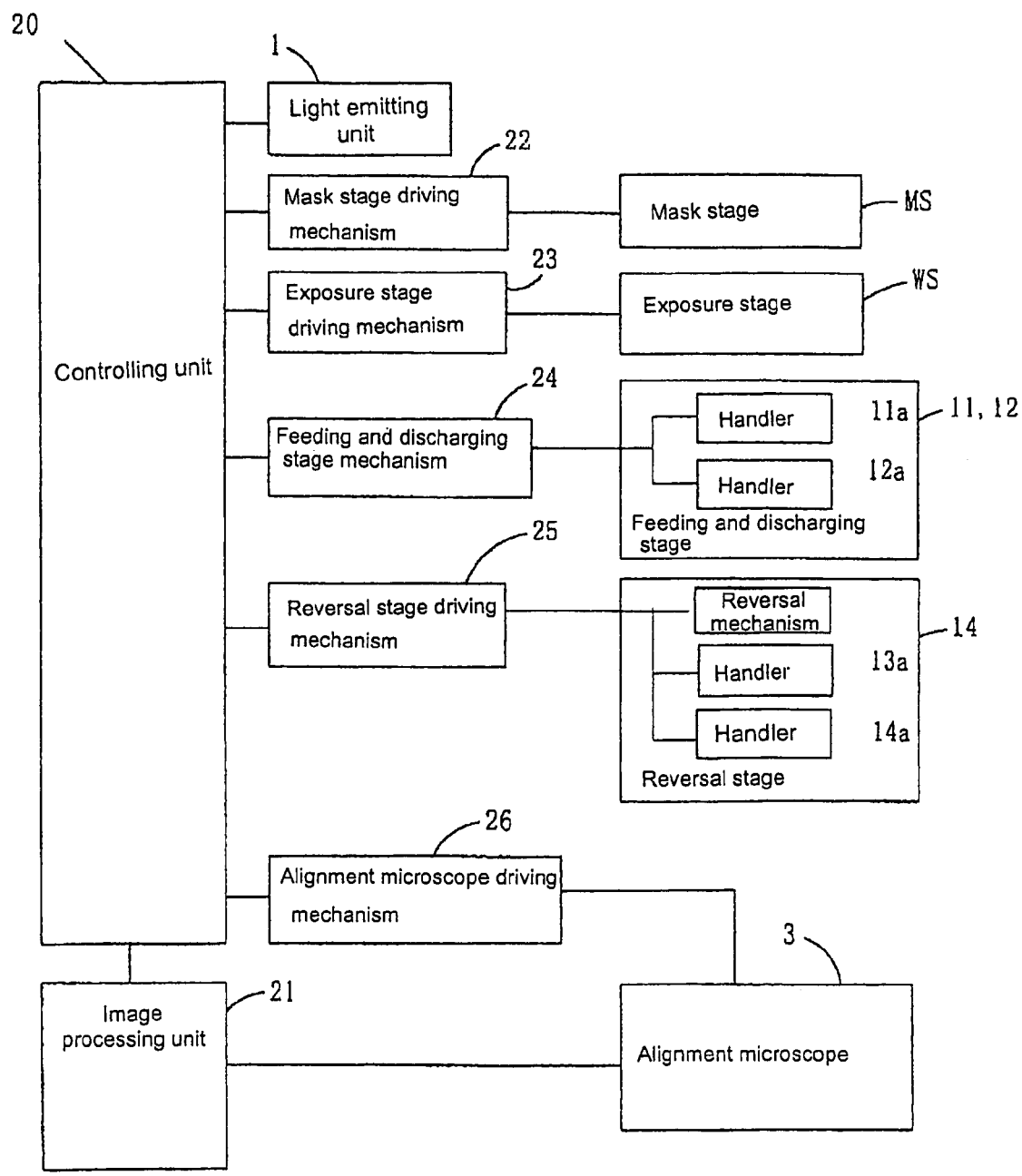
FIG. 6 shows an example of the structure of a controlling unit for controlling the both side exposure apparatus according to the present invention.

FIG. 6 shows an example of the structure of the controlling unit for controlling the both side exposure apparatus according to the present invention.

In FIG. 6, the controlling unit 20 controls the light emitting unit 1 and drives the mask stage MS by a mask stage driving mechanism 22 so as to switch the masks M1 and M2 as described above.

The exposure stage WS is driven by an exposure stage driving mechanism 23 so as to move the exposure stage WS to the exposure position A, the transportation handing over position B, and the reversal handing over position C, and the exposure stage is driven when the mask M1 or M2 and the work piece W are aligned.

Further, the handlers 11a and 12a are operated by a feeding and discharging stage driving mechanism 24 so as to feed and discharge the work piece W.

Further, handlers 11a and 12a is operated by a feeding and discharging stage driving mechanism 24 so as to feed and discharge the work piece.

As described above, the reversal stage 13 is rotated by a reversal stage driving mechanism 25 thereby carrying out the reversal operation of the work piece W, and the handlers 13a and 14a are operated so as to transport the work piece W among the exposure stage WS, the reversal stage 13 and the reversal handing over stage 14.

The alignment microscope 3 is inserted between the projection lens 2 and the exposure stage WS, and evacuated therefrom by an alignment microscope driving mechanism 26.

The image processing unit 21 is controlled by the controlling unit 20 so that the mask mark image of the mask M1 or M2 detected by the alignment microscope 3 is processed and the position thereof is detected and stored in a memory.

As described above, the work mask image detected by the alignment microscope 3 is processed so as to detect the position of the mask work, shift length from the position of the mask mark of the mask M1 or M2 is calculated.

The controlling unit 20 drives the exposure stage driving mechanism 23 based on the shift length so as to position the mask M1 or M2 and the work piece W.

Next, an operation of transportation of the work piece W according to the present invention is described below.

The controlling unit 20 controls the light emitting unit 1, the mask stage MS, the exposure stage WS, the handlers 11a and 12a of the work piece feeding and discharging stages 11 and 12, the reversal stage 13 and the handlers 13a and 14a of the reversal stage 13. The controlling unit 20 also controls the alignment microscope 3 to be inserted between the projection lens 2 and the exposure stage, and evacuated therefrom, the alignment microscope 3 to detect the mask mark and the work mark, the image processing unit 21 to detect the position of the work mark and the mask mark, and to store the position information of the mask mark, to position the mask M1 or M2 and the work piece W. The both side exposure processes are carried out as described below.

Figure 7:
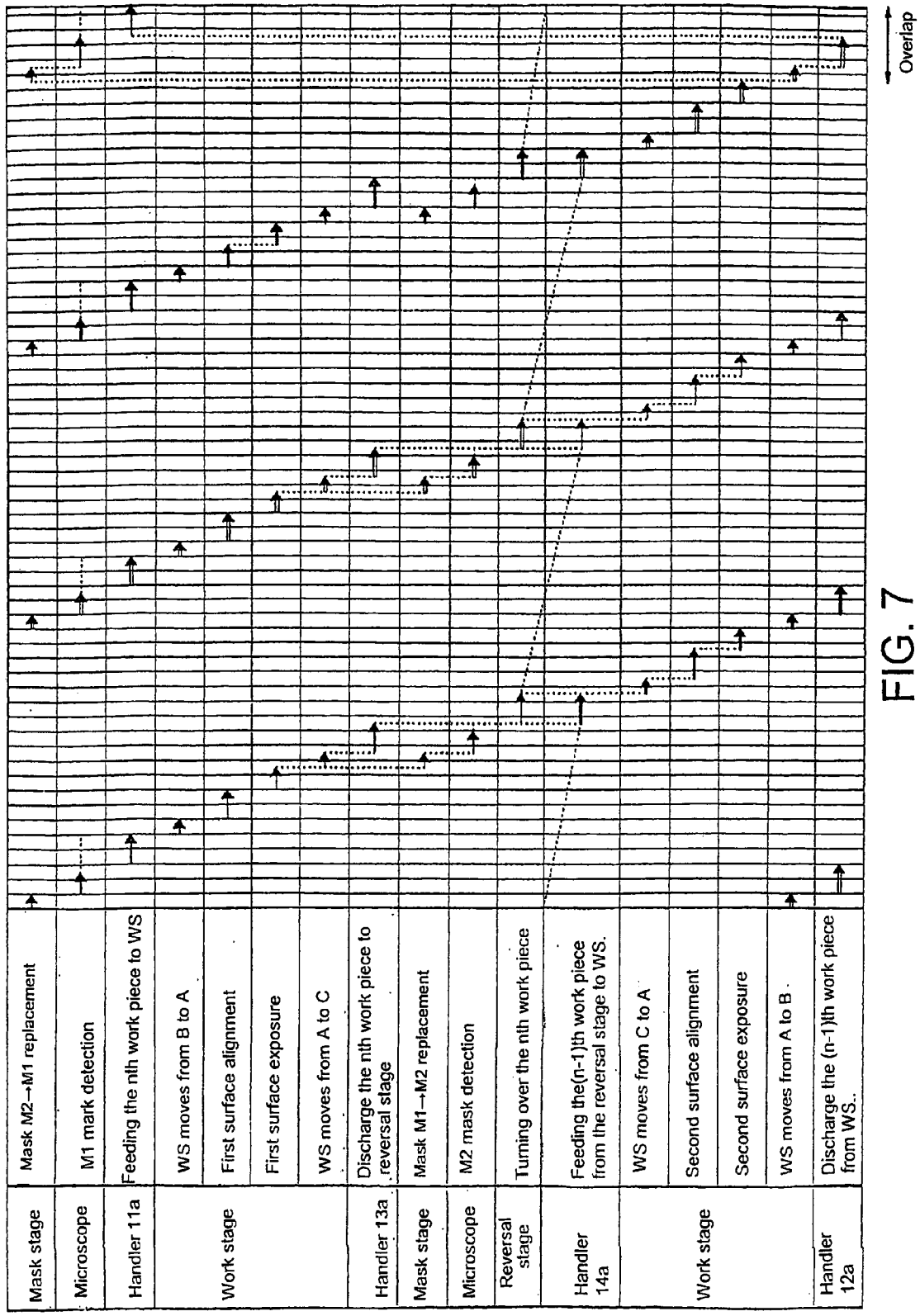
FIG. 7 is a timing chart showing operations of transportation of the work and processing of the work according to the present invention.
Figure 8:
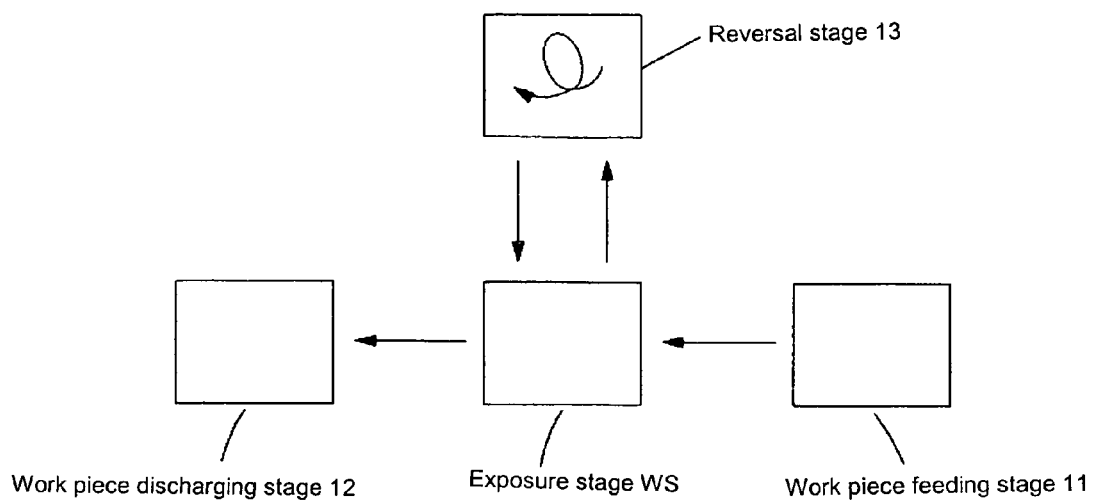
FIG. 8 is a schematic view of prior art structure of a both side projection exposure apparatus having one exposure stage and one projection lens.

FIG. 7 is a timing chart showing operations of work transportation and work processing of an embodiment according to the present invention.

The both side exposure process of the embodiment according to the present invention will be described, referring to FIGS. 1–3 and 7. Work pieces to be exposed are numbered in order as (n−2), (n−1), (n), and (n+1), so that they are referred as a (n−2)th work piece, a (n−1)th work piece, a (n)th work piece, and a (n+1)th work piece respectively. In FIG. 7, bold lines, thin lines and double lines show different process cycles respectively. In FIG. 7, a unit length in horizontal direction represents 2 seconds.

(a) An unprocessed (n)th work piece is fed to the feeding stage 11. Refer to the thin lines shown in FIG. 7.

The exposure stage WS is moved to the transportation handing over position B so that the first reflecting material 4a of the exposure stage WS is located beneath the projection lens 2. The mask stage MS is moved to the position at which the mask M1 for exposing the front side surface of the work piece is used. Refer to FIG. 3A.

(b) Exposure light is emitted from the light emitting unit 1 onto the mask mark MAM formed on the first mask M1. The mask mark image is projected through the projection lens 2 onto the first reflecting material 4a, and the mask mark image is reflected there on and detected by the alignment microscope 3 so that position information thereof is stored in a memory. After that, the light emission from the light emitting unit 1 is stopped.

(c) At that time, the processed (n−2)th work piece is fed from the exposure stage WS to the work piece discharging stage 12 (refer to the double lines shown in FIG. 7), and then the (n)th work is fed from the transportation stage 11 to the exposure stage WS by the handler 12a. Refer to the fine lines.

On the work piece feeding stage 11, a (n+1)th work piece to be processed is fed and waits for the following exposure process.

(d) The exposure stage WS is moved from the transportation handing over position B to the exposure position A. Refer to FIG. 2A. Then, the alignment microscope 3 is inserted between the projection lens and the exposure stage WS in order to detect the work mark provided on the (n)th work piece, and based on the stored mask mark image position, the exposure stage WS is moved in the XY directions or rotated so as to position the mask M1 and the front side surface of the (n)th work piece. After the positioning, the alignment microscope 3 is evacuated and exposure light is emitted from the light emitting unit 1 so as to expose the front side surface of the (n)th work piece.

(e) The exposure stage WS is moved from the exposure position A to the reversal handing over position C. Refer to FIG. 3B. The second reflecting material 4b of the exposure stage MS is moved beneath the projection lens 2. The mask stage MS is moved to the position at which the mask M2 for exposing the back side surface is used.

(f) Exposure light is emitted from the light emitting unit 1 onto the mask mark MAM of the second mask M2. The mask mark image is projected through the projection lens 2 onto the second reflecting material 4b and reflected thereon so that the inserted alignment microscope 3 detects the image and the position thereof is stored in the memory. After that the emission of the exposure light from the light emitting unit 1 is stopped.

(g) While the mask mark MAM of the second mask M2 is detected, the (n)th work piece whose front side surface has been exposed is transported from the exposure stage WS to the reversal stage 13 by the handler 13a.

As shown in FIG. 5, the reversal stage 13 turns over the (n)th work piece and places the work piece on the reversal handing over stage 14. During that time, the reversed (n−1)th work piece held by the handler 14a is transported to the exposure stage WS.

Next, the handler 14a holds the reversed (n)th work piece whose front surface side has been exposed and waits for next exposure at that state.

(h) The exposure stage WS is moved from the reversal handing over position C to the exposure position A so as to position the mask M2 and the (n−1)th work piece (back side surface), and after the alignment microscope 3 is evacuated, the back side surface of the (n−1) work piece is exposed by emitting exposure light from the light emitting unit 1. Refer to FIG. 2B.

(i) The exposure stage WS is moved to the transportation handing over position B, and the mask stage MS is moved to the position at which the mask M1 is used. Refer to FIG. 3A.

(j) The (n−1) work piece whose front and back side surfaces have been exposed is transported to the work piece discharging stage 12 by the handler 12a, and discharged outside the apparatus by the transportation apparatus (not shown).

Next, the (n+1) work piece is fed from the work piece feeding state 11 to the exposure stage WS by the handler 11a. The (n+2) work piece is transported to the work piece feeding stage 11 and waits for exposure.

(k) Exposure light is emitted on the mask mark MAM of the first mask M1, and the mask mark image reflected from the first reflecting material 4a is detected the alignment microscope 3 and the position information thereof is stored. Refer to FIG. 3A.

(l) The exposure stage WS is moved to the exposure position A, and after the positioning of the mask M1 and the (n+1) work piece, the front side surface of the (n+1) work piece is exposed. Refer to FIG. 2A.

(m) The exposure stage WS is moved to the reversal handing over position C, and the mask stage MS is moved to the position at which the mask M2 is used. Refer to FIG. 3B.

Exposure light is emitted on the mask mark MAM of the second mask M2, and the mask mark image reflected from the second reflecting material 4b is detected by the alignment microscope 3, and the position information thereof is stored in a memory. The (n+1) work piece is transported to the reversal stage 13 by the handler 13a.

(n) The (n) work piece reversed by the handler 14a is transported to the exposure stage WS. The (n+1) work piece is turned over by the reversal stage 13 and placed on the reversal handing over stage 14. The reversed (n+1) work piece is held by the handler 14a and waits for exposure.

(o) The exposure stage WS is moved to the exposure position A, and after the positioning of the mask and the work piece, the back side surface of the (n) work piece is exposed. Refer to FIG. 2B.

By repeating the above process, the front and back side surfaces of the work piece fed from the work piece feeding stage 11 is in order exposed and discharged from the discharge stage 12.

Although, a method in which replacement of the mask is carried out by placing 2 masks on one stage and the mask stage is slidably moved is described above, other methods may be adopted. For example, a mask storing portion for storing a mask in the apparatus may be provided, and a mask which is not used may be removed from the mask stage by a hander so as to store the mask in the mask storing portion, and a mask to be used may be picked up therefrom and set on the mask stage. The relationship of the position of the exposure A, the transportation handing over position B, and the reversal handing over position C, and the positions at which the reflecting materials 4a and 4b are disposed are not limited to the above embodiments. For example, it is possible to provide the transportation handing over position B which is provided in the X-axis with respect to the exposure position A and the reversal handing over position C is provided in the Y-axis which runs at right angle to the X axis wherein the reflecting materials 4a and 4b are located beneath the projection lens when the exposure stage is located at the transportation handing over position B, or the reversal handing over position C.

As described above, in the present invention, the advantages described below can be obtained.

In the present invention, as described above, since the exposure of the second surface (back side surface) of the (n−1)th work piece and the exposure of the first surface (front side surface) of the (n+1)th work piece is carried out in a period between the exposure of the first surface (front side surface side) of the (n)th work piece and the exposure of the second surface (back side surface) of the (n)th work piece, the exposure process becomes smooth so that the processing time can be reduced. Therefore, it is possible to realize an apparatus having high throughput so as not to increase the cost without providing two expensive projection lenses.

Since the two reflecting materials are attached to the exposure stage and further when the exposure stage is moved, the mask mark image of the mask is projected on the reflecting material, the position information of the mask mark can be stored at the same time when the work piece is replaced. Also, the replacement of the work piece and the detection of the position of the mask can be carried out thereby preventing the throughput from deteriorating. As a result, it is possible to immediately move on to the positioning of the mask and the work piece and it is possible to smoothly carry out a series of the exposure process.

Further, when the work piece is replaced, the exposure stage is moved to the transportation handing over position or the reversal handing over position so that the exposure stage deviates from the position at which the exposure stage is located beneath the projection lens. Therefore, the mechanism for transporting the work piece can be operated without being interrupted by the projection lens etc., provided at the exposure position, and it is possible to reduce the structural restriction of the mechanism for transporting the work piece.

The disclosure of Japanese Patent Application No. 2002-372106 filed on Dec. 24, 2002 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention. Further, the present invention possesses a number of advantages or purposes, and there is no requirement that every claim directed to that invention be limited to encompass all of them.

What is claimed is:

1. A projection exposure apparatus having a light emitting unit, an exposure stage on which a work piece is placed, a first mask for exposing a first pattern on a first surface of the work piece, a second mask for exposing a second pattern on a second surface of the work piece, a projection lens for projecting the first pattern formed on the first mask and the second pattern formed on the second mask on the work piece placed on the exposure stage, an alignment microscope for detecting a first alignment mark formed the first mask or a second alignment mark formed the second mask and the work piece, a reversal stage for turning over the work piece whose first surface is exposed, and a controlling unit for controlling emission of exposure light from the light emitting unit, replacement of the first and second masks, transportation of the exposure stage, an alignment process by the alignment microscope, a work piece reversal process by the reversal stage, and transportation of the work piece, wherein a first reflecting material and a second reflecting material provided on a surface of the exposure stage, and the controlling unit controls so that when the exposure stage is moved from an exposure position where an exposure process is carried out on the work piece to a work piece feeding and discharging position where the work piece which is exposed is replaced with a work piece to be exposed, exposure light is emitted from the light emitting unit to the first alignment mark on the first mask and an image of the first alignment mark of the first mask is projected on the first reflecting material, and a reflected image of the first alignment mark image which is projected is detected by the alignment microscope thereby detecting position of the first mask, when the exposure stage is moved to a reversal handing over position where the work piece whose first surface of the work piece is exposed is replaced with a reversed work piece to be exposed, exposure light is emitted to the alignment mark of the second mask from the light emitting unit, an image of the second alignment mark of the second mark is projected on the second reflecting material, and a reflected image of the projected second alignment mark image is detected by the alignment microscope thereby detecting position of the second mask.

2. A projection exposure apparatus comprising:

an exposure stage having a first reflecting material and a second reflecting material thereon;

a light emitting unit for emitting light;

an alignment microscope; and a controlling unit in which when the exposure stage is moved from an exposure position where an exposure process is carried out on a work piece to a work piece feeding and discharging position where the work piece which is exposed is replaced with a work piece to be exposed, exposure light is emitted from the light emitting unit to a first alignment mark on a first mask and an image of the first alignment mark of the first mark is projected on the first reflecting material, and a reflected image of the first alignment mark image which is projected is detected by the alignment microscope thereby detecting position of the first mask, when the exposure stage is moved to a reversal handing over position where the work piece whose first surface of the work piece is exposed is replaced with a reversed work piece to be exposed, exposure light is emitted to a second alignment mark of a second mask from the light emitting unit, an image of the second alignment mark of the second mark is projected on the second reflecting material, and a reflected image of the projected second alignment mark image is detected by the alignment microscope thereby detecting position of the second mask.

* * * * *